United States Patent
Beauchamp et al.

(10) Patent No.: US 6,434,441 B1
(45) Date of Patent: Aug. 13, 2002

(54) DESIGNING AND MAKING AN ARTICLE OF MANUFACTURE

(75) Inventors: Philip Paul Beauchamp, Rexford, NY (US); Jeffrey David Erno, Stanton, CA (US); Byron Andrew Pritchard, Jr.; Richard Wade Stickles, both of Loveland, OH (US)

(73) Assignee: General Electric Company, Schenectady, NY (US)

(*) Notice: Subject to any disclaimer, the term of this patent is extended or adjusted under 35 U.S.C. 154(b) by 0 days.

(21) Appl. No.: 09/186,208

(22) Filed: Nov. 5, 1998

Related U.S. Application Data (60) Provisional application No. 60/083,595, filed on Apr. 30, 1998.

(51) Int. Cl.⁷ .............................................. G06F 19/00
(52) U.S. Cl. ..................... 700/98; 700/97; 700/118; 700/163; 700/105; 700/182; 345/419; 345/420; 345/441; 382/153; 382/154; 359/58; 703/2; 703/22
(58) Field of Search ............................ 700/97, 98, 117, 700/118, 163, 104–105, 152, 13–14; 345/418, 419, 420, 427, 428, 441; 382/153, 154; 359/58; 703/22, 126

(56) References Cited

U.S. PATENT DOCUMENTS

| | | | |
|---|---|---|---|
| 5,006,990 A | | 4/1991 | Ward et al. ................ 364/768 |
| 5,033,005 A | | 7/1991 | Haske ................... 364/474.29 |
| 5,177,689 A | | 1/1993 | Kinasi et al. .......... 364/474.26 |
| 5,191,534 A | * | 3/1993 | Orr et al. .................... 700/105 |
| 5,309,366 A | | 5/1994 | Grenkowitz ........... 364/474.24 |
| 5,432,703 A | * | 7/1995 | Clynch et al. ............... 700/118 |
| 5,434,803 A | * | 7/1995 | Yoshida ....................... 700/98 |
| 5,485,390 A | | 1/1996 | LeClair et al. .......... 364/474.24 |
| 5,487,012 A | * | 1/1996 | Tompholm et al. ......... 700/163 |
| 5,539,649 A | * | 7/1996 | Walsh et al. ................ 700/163 |
| 5,543,103 A | * | 8/1996 | Hogan et al. ............... 700/163 |
| 5,552,992 A | * | 9/1996 | Hunter ....................... 700/118 |
| 5,594,651 A | | 1/1997 | St. Ville ................ 364/468.04 |
| 5,687,094 A | * | 11/1997 | Kagawa et al. ............. 700/105 |
| 5,742,288 A | * | 4/1998 | Nishizaka et al. .......... 700/163 |
| 5,745,390 A | * | 4/1998 | Daneshgari ................. 700/98 |
| 5,926,388 A | * | 7/1999 | Kimbrough et al. ......... 700/98 |
| 5,933,353 A | * | 8/1999 | Abriam et al. .............. 700/182 |
| 5,966,310 A | * | 10/1999 | Maeda et al. ................ 700/98 |
| 6,036,345 A | * | 3/2000 | Jannette et al. ............. 700/105 |
| 6,065,857 A | * | 5/2000 | Hazama et al. .............. 700/98 |
| 6,148,277 A | * | 11/2000 | Asava et al. .................. 703/22 |
| 6,256,599 B1 | * | 7/2001 | Tiribuzi ........................ 703/2 |

\* cited by examiner

Primary Examiner—Ramesh Patel
(74) Attorney, Agent, or Firm—George C. Goodman; Donald S. Ingraham (57) ABSTRACT

A method for designing, and optionally making, an article of manufacture. Customer requirement parameters are defined and related engineering parameters are chosen. A parametric geometrical representation (i.e., a master model) of the article is created in terms of geometric parameters using a computer program. A design analysis methodology is crated and programmed into a computer code and stored on a computer medium such that the engineering parameters and the customer requirement parameters are program inputs and the geometric parameters of the master model are program outputs. Specific values of the inputs are inputted into the computer code. The computer code is run on a digital computer and specific values of the geometric parameters of the master model are outputted.

6 Claims, 7 Drawing Sheets fig. 1 fig. 2 fig. 3 fig. 4 fig. 5 fig. 6 fig. 7

DESIGNING AND MAKING AN ARTICLE OF MANUFACTURE

This application claims priority of a Provisional Application entitled "Designing and Making an Article of Manufacture" by Philip P. Beauchamp, et al., Ser. No. 60/083,595 filed Apr. 30, 1998.

FIELD OF THE INVENTION

The present invention relates generally to engineering computer design tools, and more particularly to a process, a digital computer, and a medium readable by a digital computer for the engineering design, and optionally the making, of an article of manufacture.

BACKGROUND OF THE INVENTION

Known methodologies for the engineering design of parts (i.e., articles of manufacture) have included the use of computer spreadsheets programmed with a mathematical geometric model of the article which allows the design engineer to vary one or more geometric variables, with the spreadsheet calculating the values of the other geometric variables within desired constraints. In some instances the mathematical geometric model of the article is represented as a parametric geometry model. Such models are typically developed using commercially available Computer Aided Design (CAD) programs. Examples of such programs include Unigraphics, PRO-Engineer, IDEAS, etc.

Typically, the design engineer develops an initial geometric description of the article, assigns values to the dimensions and runs a separate mathematical engineering analysis, using such initial geometry values, to determine the engineering aspects of the design. The design engineer then varies certain geometric variables and reruns the mathematical engineering analysis. This is repeated until acceptable values for the engineering aspects of the design are reached. The final geometry of the design is checked against customer requirements, such as life cycle requirements. Then, the design engineer forwards the design to manufacturing personnel who perform an analysis to determine if the article can be manufactured and then either return the design to the design engineer for modification or proceed to develop the manufacturing process and actually make the part.

What is needed is a more efficient modality for designing and making an article of manufacture.

SUMMARY OF THE INVENTION

The method of the invention for designing an article of manufacture includes steps a) through i). Step a) includes defining one or more customer requirement parameters. Step b) includes creating a parametric geometrical representation of the article of manufacture (i.e., a master model) in terms of geometric parameters using a computer aided design program. Step c) includes storing the master model on a computer medium. Step d) includes choosing one or more engineering parameters relating to the customer requirement parameters. Step e) includes creating a design analysis methodology that relates the master model to the engineering parameters and the customer requirement parameters. Step f) includes programming the design analysis methodology into a computer code such that the engineering parameters and customer requirement parameters are program inputs and the geometric parameters of the master model are program outputs. Step g) includes storing the computer code on the computer medium. Step h) includes inputting specific values of the engineering parameters and the customer requirement parameters into the computer code. Step I) includes running the computer code on a digital computer and outputting therefrom specific values of the geometric parameters of the master model.

In one implementation, the method is also for designing a manufacturing process for making the article of manufacture and includes steps j) through o). Step j) includes choosing a manufacturing process including manufacturing criteria and one or more manufacturing enablers to make the article of manufacture. Step k) includes creating a manufacturing analysis methodology that relates the manufacturing process to the engineering parameters and the geometric parameters of the master model. Step I) includes creating a parametric geometrical representation of the manufacturing enablers in terms of geometric parameters using a computer aided design program, the parametric geometrical representation of the manufacturing enablers defining a manufacturing enabler model. Step m) includes storing the manufacturing enabler model on the computer medium. Step n) includes incorporating the manufacturing analysis methodology into the computer code such that the manufacturing criteria are computer code inputs. Step o) includes inputting specific values of the manufacturing criteria into the computer code. In this implementation, step i) also includes outputting from the computer code specific values of the geometric parameters of the manufacturing enabler model.

In another implementation, the computer code is an iterative computer code, and the outputted specific values of the geometric parameters of the master model and/or the manufacturing enabler model may be manually overridden after which the computer code continues to iteratively rerun and output other specific values while keeping the manually overridden values.

In an additional implementation, the method is also for making the article of manufacture and includes the step of making the article of manufacture having the outputted specific values of the geometric parameters of the master model obtained from step i) with the outputted specific values of the geometric parameters of the manufacturing enabler model also obtained form step i).

Several benefits and advantages are derived from the invention. Using desired engineering parameters as inputs, instead of nominal geometric parameters, shortens the engineering design time. Factoring the manufacturability into the design process means that the manufacturing personnel will not have to review and/or analyze a given design for producibility. This shortens the overall time to design and make the part. Factoring in customer requirements ensures that the quality of the parts produced meets the customer expectations which reduces warranty work on the manufacture's part and reduces potential downtime on the customer's part. Allowing for manually overriding the outputted specific values from the compute code of the geometric parameters of the master model and/or manufacturing enabler model provides for rapid design and manufacture of different specific articles within the same type of article (or same type manufacturing process) wherein different specific articles (or different specific manufacturing processes) have different hard constraints on one or more of their geometric parameters, as can be appreciated by those skilled in the art.

DETAILED DESCRIPTION OF THE INVENTION

The present invention can be expressed as a process, a digital computer, or a medium readable by a digital computer for the engineering design, and optionally the making, of an article of manufacture. Such articles or parts can range from the simple to the complex, and include, without limitation, a bolt or a gas-turbine combustor.

Figure 1:
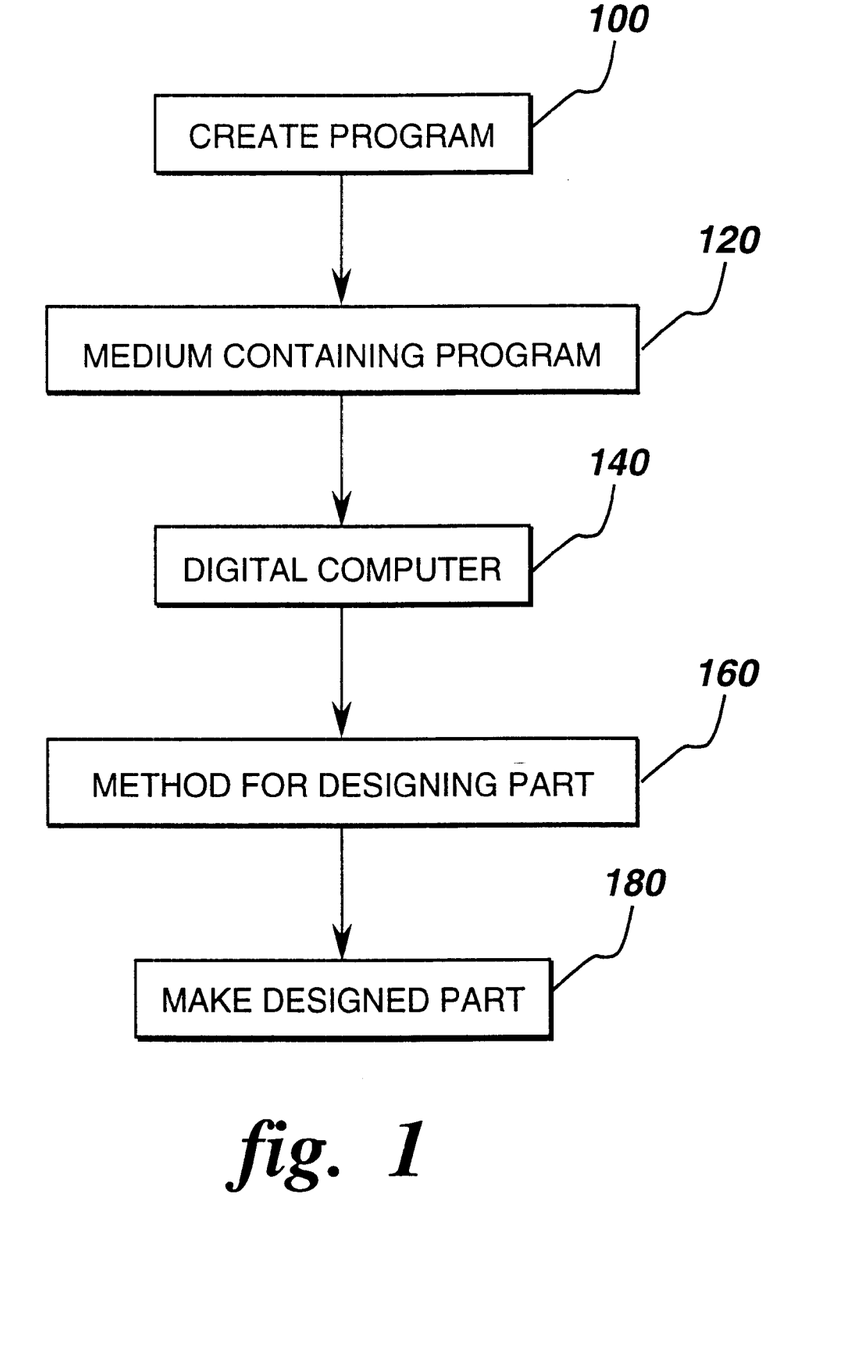
FIG. 1 is a hybrid apparatus/process block diagram (i.e., flow chart) of an implementation of the method of the invention for designing and making an article of manufacture.

An organization of the overall invention is shown in the hybrid apparatus/process block diagram of FIG. 1. Block 100 is entitled "Create Program", such program being stored in block 120 which is entitled "Medium Containing Program". Such medium is readable by a digital computer. A medium is a computer hard disk. Other such mediums include, without limitation, floppy disks and CD-RW disks. Block 120 is read by block 140 which is entitled "Digital Computer". The choice of the digital computer is left to the artisan. However, one choice of a digital computer is a Hewlett Packard 9000/C110 running an HPUX operating system. The program on the medium causes the digital computer to execute block 160 which is entitled "Method for Designing Part". Information which defines the designed part is sent to block 180 which is entitled "Make Designed Part". The contents of blocks 100, 160, and 180 will be further explained below.

Figure 2:
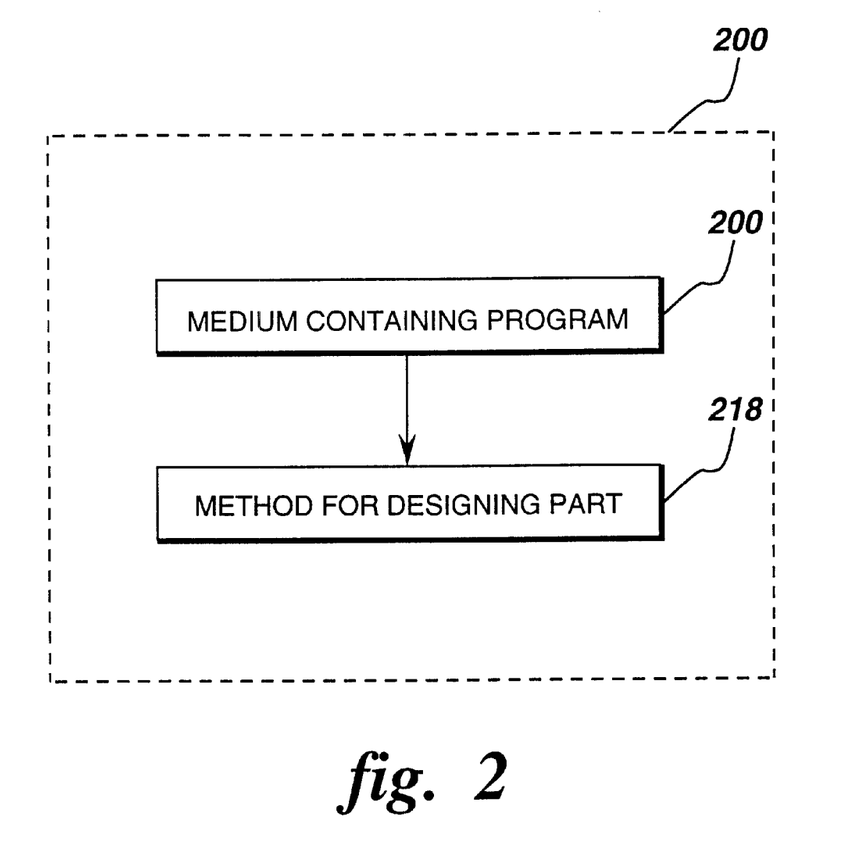
FIGS. 2 is a block diagram expanding individual block 100 of FIG. 2.

Block 100 is shown in more detail in the process flow chart of FIG. 2. Block 100 includes block 200 entitled "Create Design Program" followed by block 210 entitled "Create Manufacturing Program". Block 200 is shown in greater detail in FIG. 3 as including blocks 1 through 7 as hereinafter defined which correspond to process steps 1–7 as hereinafter explained. Block 210 is shown in greater detail in FIG. 4 as including blocks 211 through 215 as hereinafter defined which correspond to process steps A–E as hereinafter explained. Block 160 is shown in greater detail in FIG. 5 as including blocks 8–14 as hereinafter defined which correspond to process steps 8–14 as hereinafter explained. Block 180 is shown in greater detail in FIG. 6 as including blocks 15–17 as hereinafter defined which correspond to process steps 15–17 as hereinafter explained. It is noted that block 6 provides for the performance of the steps shown in FIG. 7 as including blocks 301–310 as hereinafter defined which correspond to process steps I–X (Roman Numerals) as hereinafter explained.

The following, which is referred to as Outline 1, describes the steps in the process.

Figure 3:
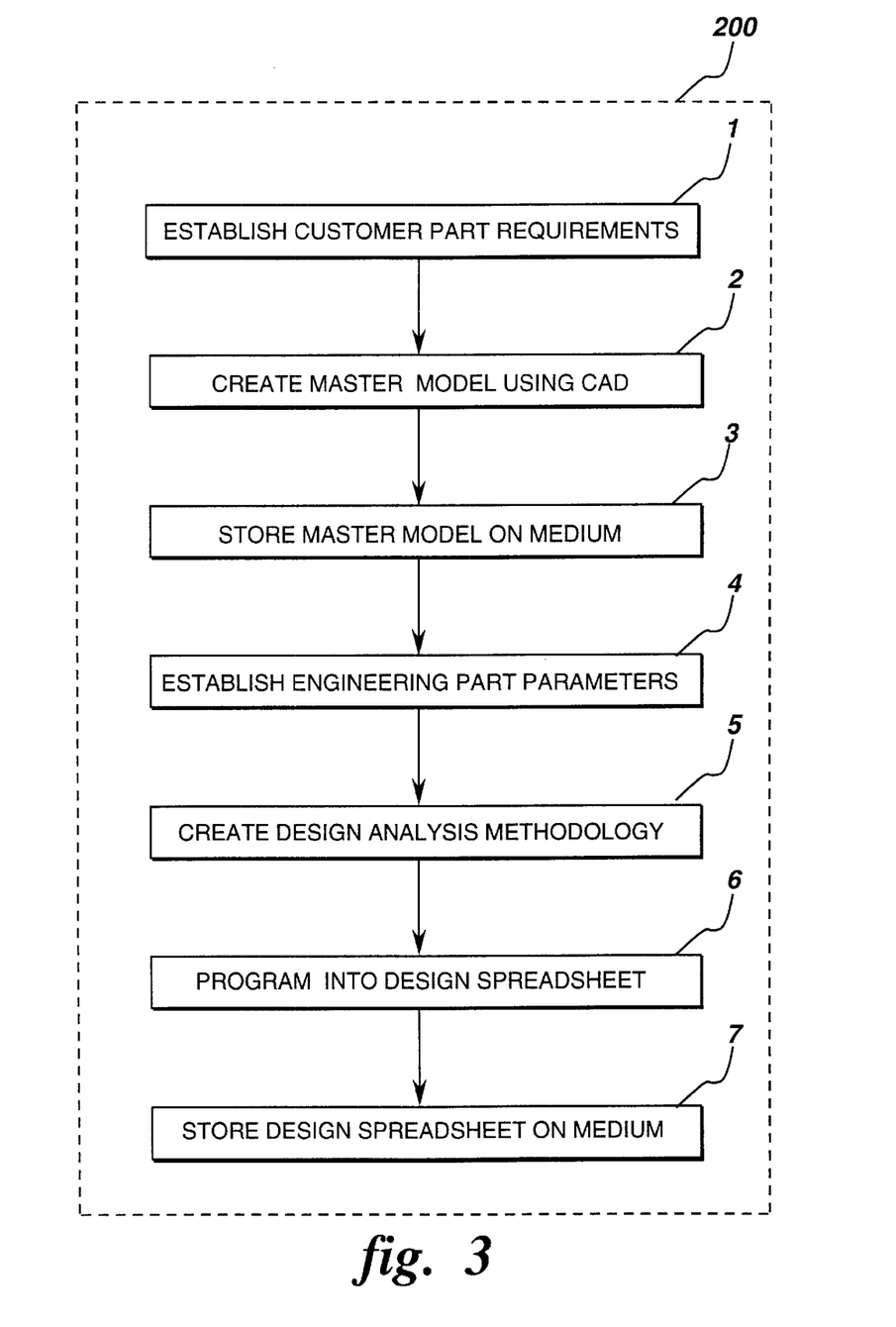
FIG. 3 is a block diagram expanding individual block 200 of FIG. 2.

"Establish (i.e., define) the customer requirement parameters for the part" is step 1 in the process and is shown in FIG. 3 as block 1 entitled "Establish Customer Part Requirements". Customer requirements are defined as specific values or constraints of the customer requirement parameters on the overall performance of a part which the part is expected to meet. Examples include, but are not limited to, maximum weight, minimum life, minimum reliability, minimum strength, durability, minimum environmental operating conditions, conformance to a standard, cost, etc. As an example consider a common cereal box. Here the customer (a cereal manufacturer) might want a box with minimum cost, capable of holding X ounces of their product, with a minimum strength which allows for 10 filled boxes to be stacked without crushing the bottom box.

"Create a parametric geometrical representation of the part (Master Model) using a Computer Aided Design (CAD) program" is step 2 in the process and is shown in FIG. 3 as block 2 entitled "Create Master Model Using CAD". A Master Model (i.e., a parametric representation of a part) is defined as a computer model/representation usable within a Computer Aided Design Software, (commercially available examples of which are Unigraphics, ProE, IDEAS, etc.) in which part geometry is described in terms of features (holes, lines, curves, chamfers, blends, radii, etc.) and dimensional parameters associated with these features which at any given time take on specific numerical values. This representation of a part is often referred to as a rubber band part because all its dimensions are flexible. For the cereal box example, the box is described by its length, width, height, and thickness of the cardboard all of which may vary. To understand the flexibility of this model, note that this also is a description of a mover's packing box.

"Store the Master Model on a computer medium" is step 3 in the process and is shown in FIG. 3 as block 3 entitled "Store Master Model on Medium".

"Establish (i.e., choose) the engineering parameters relating to the successful design of the part (i.e., relating to the customer requirement parameters)" is step 4 in the process and is shown in FIG. 3 as. block 4 entitled "Establish Engineering Part Parameters". An engineering parameter is defined as a variable having a value or array of values used as the inputs to a design process whose goal is to establish the final parametric values of a part whose performance meets the customer input requirements. Examples include but are not limited to temperatures, pressures, material properties, number of instances of an item (as in the number of blades in a compressor row), pressure drops, etc. For the cereal box example this preferably is the material properties of the cardboard, density of the product, etc.

"Create a design analysis methodology that relates the parametric geometrical representation of the part (i.e., the master model) to the engineering parameters and customer requirement parameters" is step 5 in the process and is shown in FIG. 3 as block 5 entitled "Create Design Analysis Methodology". The design analysis methodology is defined as the sequence of engineering analyses that are performed to determine if the part meets the desired customer specified functional requirements. While this analysis is specific to the part being designed, it is also general enough in nature that it allows the various part dimensions to be altered as needed. For a given part this preferably includes any and all combinations of analytically derived results, results of analysis from Commercial Off-The-Shelf Software, response surfaces from a Design of Experiments, a company proprietary empirical procedure, a company standard design practice, text book procedures, etc. in an appropriate order. For the cereal box this preferably, without limitation, is a series of computations such as 1) compute the required volume based on product density, 2) select the main dimensions to obtain the volume based a company procedure for esthetic box sizes, 3) compute the critical crushing parameters based on thickness, dimensions, and material properties, 4) compute cost based on empirical model relating surface area to cost. The design analysis methodology includes steps to compare results to desired requirements, to adjust dimensions accordingly, and to iterate, as can be appreciated by the artisan.

"Program the design analysis methodology into a Design Spreadsheet (i.e., a computer code which is a computer spreadsheet program or other non-spreadsheet computer program for a digital computer) in such a way that the engineering parameters and customer requirement parameters are the inputs and the geometric dimensions are the outputs (details of the suggested methodology for this step are provided in Outline 2)" is step 6 in the process and is shown in FIG. 3 as block 6 entitled "Program Into Design Spreadsheet". Once the design analysis methodology is defined, it is programmed into a computer code (i.e., a spreadsheet or other suitable computer program) for use by the design engineer. Since it is general in nature to all parts of the same configuration and requirements, it is reusable for multiple parts. For example a good cereal box spreadsheet design tool preferably is used to design all sizes of cereal boxes. Complete details of how this is done including the methodology are provided in Outline 2 as hereinafter explained. An example of the Design Spreadsheet is the XESS spreadsheet environment in Unigraphics which is available from the EDS Unigraphics Division of the Electronics Data Systems Corporation.

"Store the Design Spreadsheet (i.e., computer code) on the medium" is step 7 in the process and is shown in FIG. 3 as block 7 entitled "Store Design Spreadsheet On Medium".

The Following Steps (A–E) in the Process Are For an optional Methodology and are not required for the basic design process.

Figure 4:
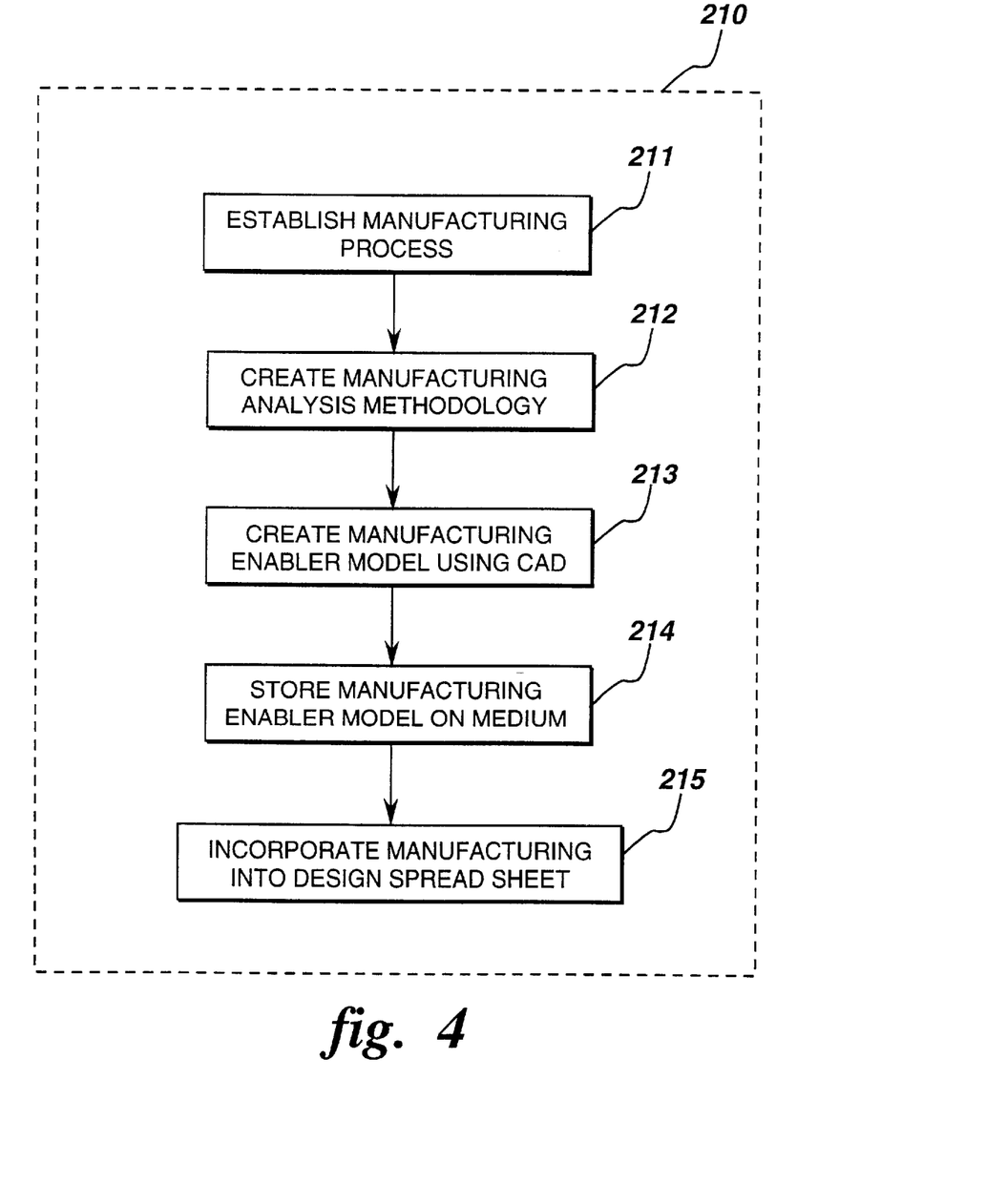
FIG. 4, is a block diagram expanding individual block 210 of FIG. 2.

"Establish (i.e., choose) the manufacturing process including manufacturing criteria and one or more manufacturing enablers that will be used to make the part" is step A in the process and is shown in FIG. 4 as block 211 entitled "Establish Manufacturing Process". Once the article of manufacture has been defined it is possible to establish the manufacturing process that will be used to make the part. The process generally consists of a number of steps in which the raw material, for example a sheet of cardboard stock, is converted into the final part, a cereal box. For the cereal box some of the steps might include cutting out the shape of the box with its flaps from a flat sheet of cardboard, applying the packaging design to one side, stamping the sheet to pre-crease the fold locations, folding, gluing, etc. In general terms, a manufacturing enabler is a representation of a manufacturing process input or an input component of the manufacturing process that is consistent with a specific instance of a designed part. Examples include, process sheets to produce the component, drafting drawings, parametric master models for the tooling (Tooling Model), parametric master models for fixtures (Fixture Model), parametric master models for casting geometry associated with a component (Casting Model), input data for NC machinery, tables of standard available stock sizes, etc. Manufacturing criteria are manufacturing parameters such as wall thickness of a mold used to make the part.

"Create a manufacturing analysis methodology that relates the manufacturing process to the engineering parameters and the parametric geometrical dimensions of the part (i.e., the geometric parameters of the master model)" is step B in the process and is shown in FIG. 4 as block 212 entitled "Create Manufacturing Analysis Methodology". A manufacturing analysis methodology or process capability model is defined as a numerical representation of a manufacturing process and/or process capability that relates the required output part to the input manufacturing enablers (as defined in step C below). Examples of manufacturing analysis methodologies include models of sheet metal forming process, models of casting process, forging processes models, machine press operations, machining tolerance process models, assembly tolerancing models, etc. For the cereal box, an example manufacturing analysis model preferably is the process for cutting out the box shape. For this cutting process the analysis might include first selecting a standard cardboard sheet size from a manufacturing enabler table of standards and then relating the cutter speed to the sheet dimensions and sheet properties to produce an estimate of whether the cardboard cuts or tears, the later of which preferably requires some changes to either the process (cutter speed) or the design of either the box or the cutter blade.

"Create the parametric geometrical representation(s) of the manufacturing enabler(s) (i.e., a Manufacturing Enabler Model) in terms of geometric parameters associated with the manufacturing process for the part (Manufacturing Enabler Model) using a Computer Aided Design (CAD) program" is step C in the process and is shown in FIG. 4 as block 213 entitled "Create Manufacturing Enabler Model Using CAD". A Manufacturing Enabler Model is defined as a computer model or representation usable within a Computer Aided Design Software, (commercially available examples of which are Unigraphics, ProE, IDEAS, etc.) in which a hardware component specific to the manufacturing process for the particular part is described in terms of features (holes, lines, curves, chamfers, blends, radii, etc.) and dimensional parameters associated with these features which at any given time take on specific numerical values. Examples included Tooling Models, Fixture Models, Casting Models, etc. For the cereal box example, a Tooling Model is the cardboard paper cutter mathematical model that represents the unfolded and unglued shape of the box, including all the end flaps that are used to cut the box template from a sheet of cardboard. Another example is the press tooling that preferably is used to pre-crease the folds prior to folding the box.

"Store the Manufacturing Enabler Model on a computer medium" is step D in the process and is shown in FIG. 4 as block 214 entitled "Store Manufacturing Enabler Model On Medium".

"Incorporate the manufacturing analysis methodology into the Design Spreadsheet (i.e., computer code) such that the manufacturing criteria are computer code inputs" is step E in the process and is shown in FIG. 4 as block 215 entitled "Incorporate Manufacturing Into Design Spreadsheet". Once the manufacturing analysis methodology and its associated Manufacturing Enabler Models are defined, the numerical representation of the manufacturing analysis methodology is programmed into the Design Spreadsheet (i.e., computer code). Since it is added to the design analysis methodology, it provides the spreadsheet with the ability to design parts which meet the customer requirements and which simultaneously meet the requirements of the manufacturing capability of the factory floor. Like the design analysis methodology, it is general in nature to all parts of the same configuration, and it is reusable for multiple parts. For example, the cereal box spreadsheet design tool is able to be used to design all sizes of cereal boxes and in addition prevents the design of boxes that can not be made. A simple example is the design of a large box which meets all the engineering criteria but for which there is no standard cardboard sheet available which is large enough to make the designed box.

Returning to the Basic Process Methodology, a description is given of additional steps in the process.

Figure 5:
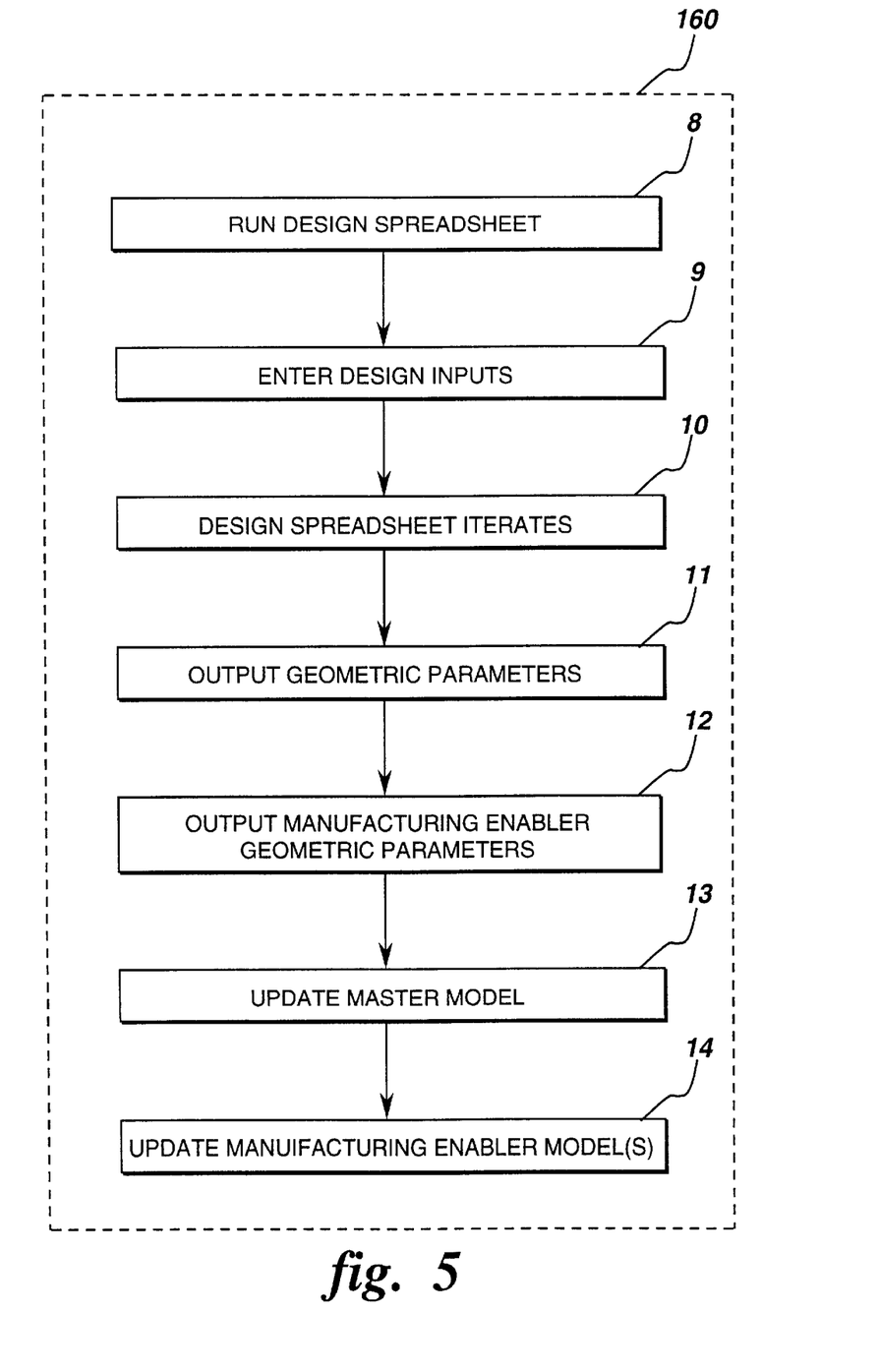
FIG. 5 is a block diagram expanding individual block 160 of FIG. 1.

"Run the Design Spreadsheet (i.e., computer code) on the digital computer" is step 6 in the process and is shown in FIG. 5 as block 8 entitled "Run Design Spreadsheet". Having established the analysis methodologies and programming them into a Design Spreadsheet stored on the computer medium, the process of designing the parametric part can be initiated by running the design spreadsheet on the digital computer.

"Design Engineer enters the design inputs" is step 9 in the process and is shown in FIG. 5 as block 9 entitled "Enter Design Inputs". The design engineer then enters the required design inputs: the specific values of the engineering parameters, customer requirement parameters, and manufacturing criteria (if applicable, such as a minimum required thickness of a mold used to make the part). If applicable, the design engineer also enters overriding geometric values as described in the spreadsheet implementation discussed in Outline 2.

"The Design Spreadsheet (i.e., computer code) iterates on the design" is step 10 in the process and is shown in FIG. 5 as block 10 entitled "Design Spreadsheet Iterates". The Design Spreadsheet then executes the numerical logic as explained in Outline 2 and iterates (if it is an iterative computer code) on the solution. As appropriate, the iteration process may or may not query the design engineer for additional inputs or allow the design engineer to override select computed values before continuing to iterate on a solution for the geometric values contained within it.

"The Design Spreadsheet (i.e., computer code) outputs specific values of the master model geometric parameters" is step 11 in the process and is shown in FIG. 5 as block 11 entitled "Output Geometric Parameters". When the Design Spreadsheet has completed the numerical execution for the part being designed, the output specific values of the geometric parameters for the part are displayed for the design engineer, and the part optionally can be made using the outputted specific values of the geometric parameters of the master model.

"The Design Spreadsheet (i.e., computer code) outputs specific values of the Manufacturing Enabler Model geometric parameters" is step 12 in the process and is shown in FIG. 5 as block 12 entitled "Output Manufacturing Enabler Geometric Parameters". In the event the Design Spreadsheet contains the manufacturing methodology noted in Steps A–E above, then when the Design Spreadsheet has completed the numerical execution for the part being designed, the output specific values of the geometric parameters for the Manufacturing Enabler Model(s) are displayed for the design engineer. In addition, if the Design Spreadsheet produces any non-CAD manufacturing enablers, such as manufacturing process sheets, they are also displayed at this time. Optionally, the part can be made using the outputted specific values of the geometric parameters of the master model using the outputted specific values of the geometric parameters of the manufacturing enabler model.

"Update Master Model with the specific values of the geometric parameters" is step 13 in the process and is shown in FIG. 5 as block 13 entitled "Update Master Model". Optionally, after review by the design engineer the geometric parameters output by the Design Spreadsheet for the part are used to update the parametric dimensions in the Master Model. In one mode of operation, the Design Spreadsheet, through internal numerical logic, updates the Master Model directly. Examples of commercially available software that provide this update method include Unigraphics and its associated XESS spreadsheet environment.

"Update Manufacturing Enabler Model(s) with specific values of their geometric parameters" is step 14 in the process and is shown in FIG. 5 as block 14 entitled "Update Manufacturing Enabler Model(s)". Optionally, in the event the Design Spreadsheet (i.e., computer code) contains the manufacturing methodology noted in Steps A–E above, then after review by the design engineer the geometric parameters output by the Design Spreadsheet for the Manufacturing Enabler Model(s) are used to update the parametric dimensions of the Manufacturing Enabler Model(s). In one mode of operation, the Design Spreadsheet, through internal numerical logic updates the Manufacturing Enabler Model(s) directly. Examples of commercially available software that provide this update method include Unigraphics and its associated XESS spreadsheet environment.

The Following Steps (Steps 15–17) in the Process Relate to the Actual Making of the Part and are Optional.

Figure 6:
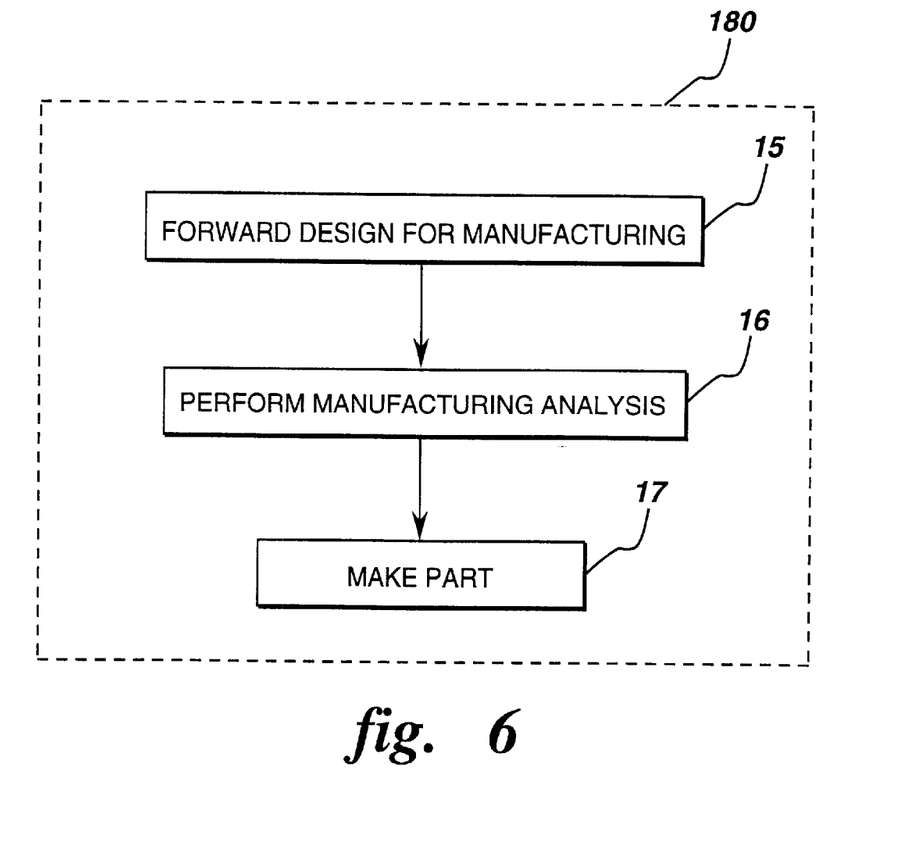
FIG. 6 is a block diagram expanding individual block 180 of FIG. 1.

"Forward design for manufacturing" is step 15 in the process and is shown in FIG. 6 as block 15 entitled "Forward Design For Manufacturing". The article of manufacture developed in steps 1–14 above can be forwarded for manufacture.

"Perform manufacturing analysis if needed" is step 16 in he process and is shown in FIG. 6 as block 16 entitled "Perform Manufacturing Analysis". If the Design Spreadsheet contains the manufacturing methodology noted in Steps A–E above, then this step typically is not performed.

"Make the part" is step 17 in the process and is shown in FIG. 6 as block 17 entitled "Make Part".

The following, which is referred to as Outline 2, describes the steps in the Development of the Design Spreadsheet Logic.

The following outline discusses the basic logic used to develop the Design Spreadsheet. It is important to note that the use of the term spreadsheet includes any type of programmable computer software. Examples include, but are not limited to, EXCEL, XESS, FORTRAN, C, C++, MOTIF, JAVA, CORBA, etc. An example of a program is one in which there is an internally provided link between the Computer Aided Design (CAD) program and the Design Spreadsheet. An example of this :is the Unigraphics CAD program and the XESS Spreadsheet program. The essential feature of the implementation is to provide a computer program whose main function is to design a part by leveraging a Master Model and then:

A. Inputting Engineering Parameters, Customer Requirements, and optional Manufacturing Criteria, B. Employing a numerical analysis algorithm, and C. Outputting the Geometric Dimensions of the Part.

This implementation is superior to the classical design methodology in which the geometry is "guessed" dimensions which are set and then iterated. The development of the Design Spreadsheet assumes that there exists a feature-based Master Model as described in Step 2 of Outline 1. Additionally, there may or may not be one or more Manufacturing Enabler Models as described in optional Step C above.

Figure 7:
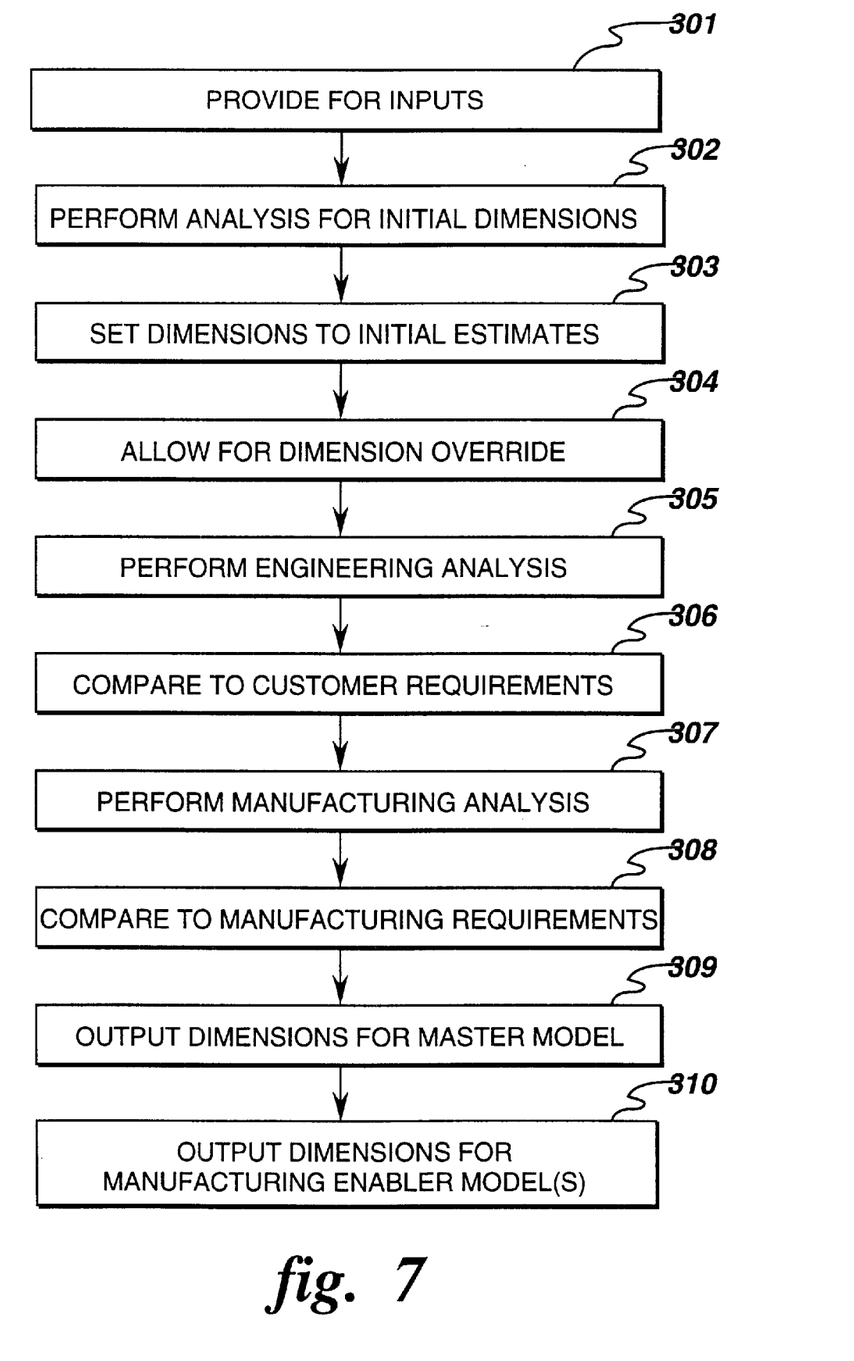
FIG. 7 is a block diagram of steps whose performance is provided for by block 6 of FIG. 3.

The Design Spreadsheet Logic provides for the following steps (shown in FIG. 7) to be performed:

"Provide For Inputs" is step Roman Numeral I in the process and is shown in FIG. 7 as block 301 entitled "Provide For Inputs". One required function of the Design Spreadsheet is to allow the design engineer to input the Engineering Parameters and Customer Requirements. It should be kept in mind that these parameters are related throughout the design analysis methodology to the part parametric (geometric) dimensions. Since the parametric (geometric) part will initially have some default set of dimensions, it is recommended that the Design Spreadsheet also have a consistent set of initial default values of the inputs. These Design Spreadsheet defaults do not have to correspond to the default part dimensions. The Design Spreadsheet provides for the following types of inputs:

A. Engineering Parameters,
B. Customer Requirements, and
C. Manufacturing Criteria (Optional).

"Perform Analysis to Determine Initial Estimates of Dimensions" is step Roman Numeral II in the process and is shown in FIG. 7 as block 302 entitled "Perform Analysis For Initial Dimensions". The Design Spreadsheet performs a simple analysis to set the initial estimates of the parametric dimensions for the part. The simple analysis used here is simply to "size" the part and provide the initial estimates for the iterative design procedure used to design the part.

"Set current dimensions of the part to the initial estimates" is step Roman Numeral III in the process and is shown in FIG. 7 as block Roman Numeral 303 entitled "Set Dimensions To Initial Estimates". This step provides a reference step for the iterative process.

"Allow design engineer to override current dimensions if desired" is step Roman Numeral IV in the process and is shown in FIG. 7 as block 304 entitled "Allow For Dimension Override". A key element of any design process is to allow the designer access to the model to override any computed value. This provides the ability for the design engineer to drive the design in a particular way to handle circumstances for which the general tool does not take account. For example, a customer might have an unusual requirement that some dimension be a fixed value. Another use for this input area is to provide the design engineer the ability to periodically access the developing design during the detailed engineering analysis of step Roman Numeral V. This provides for greater flexibility in using the Design Spreadsheet.

"Perform detailed engineering analysis" is step Roman Numeral V in the process and is shown in FIG. 7 as block 305 entitled "Perform Engineering Analysis". The Design Spreadsheet is programmed to perform the analytical representation of the design analysis methodology developed for the parametric Master Model. This analysis forms the basis of what is typically an iterative procedure, although in some instances it may require only one pass, involving steps Roman Numerals IV through VIII.

"Compare results to customer requirements" is step Roman Numeral VI in the process and is shown in FIG. 7 as block 306 entitled "Compare to Customer Requirements". The Design Spreadsheet performs a determination to evaluate if all of the customer requirements have been met.

A. If requirements are met, go to step Roman Numeral VII.
B. If requirements are not met:
1. Update current dimensions. The methodology for updating the part dimensions in the event that the convergence criteria for the design was not met is programmatically included in the Design Spreadsheet at this point. The analytic methodology for doing this is determined during the development of the design analysis methodology.
2. Return to the step following step Roman Numeral III.

"If the manufacturing analysis methodology is included, then perform manufacturing analysis, else go to step Roman Numeral IX" is step Roman Numeral VII in the process and is shown in FIG. 7 as block 307 entitled "Perform Manufacturing Analysis". In the event that the Design Spreadsheet includes the manufacturing analysis methodology then the analytical representation of the manufacturing analysis methodology is developed and programmed at this point.

"Compare results to manufacturing requirements" is step Roman Numeral VIII in the process and is shown in FIG. 7 as block 308 entitled "Compare to Manufacturing Requirements".

A. If the requirements are met, go to step IX.
B. If the requirements are not met, analytically update current part dimensions, manufacturing enabler dimension(s), or process controls as appropriate. The methodology for updating the analysis in the event that the convergence criteria for the design was not met from a manufacturing view point is programmably included in the Design Spreadsheet at this point. The analytic methodology for doing this is determined during the development of the manufacturing analysis methodology. A key difference between this update and the update in step VI.B.1. is that here any one or combination of the part geometry, the manufacturing enabler geometry, and the manufacturing input criteria are updated.
C. Return to Step Roman Numeral IV or VI as appropriate.

"Output parametric geometric part dimensions for the Master Model" is step Roman Numeral IX in the process and is shown in FIG. 7 as block 309 entitled "Output Dimensions For Master Model".

A. An example of a methodology is one in which the CAD model is directly updated by the Design Spreadsheet.

"If the manufacturing analysis methodology is included, then output the parametric geometric dimensions for the Manufacturing Enabler Model(s)" is step Roman Numeral X in the process and is shown in FIG. 7 as block 310 entitled "Output Dimensions for Manufacturing Enabler Model(s)".

A. An example of a methodology is one in which the CAD model is directly updated by the Design Spreadsheet.

Several benefits and advantages are derived from the invention. Using desired engineering parameters as inputs, instead of nominal geometric parameters, shortens the engineering design time. Factoring the manufacturability into the design process means that the manufacturing personnel will not have to review and/or analyze a given design for producibility. This shortens the overall time to design and make the part. Factoring in customer requirements ensures that the quality of the parts produced meets the customer expectations which reduces warranty work on the manufacture's part and reduces potential downtime on the customer's part.

It is understood that the order of performing the steps of the process may be varied, if logically feasible, as is within the understanding of those skilled in the art. For example, and without limitation, in FIG. 2, block 210 entitled "Create Manufacturing Program" can come before block 200 entitled "Create Design Program". Also, steps IV–VIII can be performed in any logical order, as can be understood by the artisan. It is further understood that certain steps are optional, as previously described and as can be appreciated by the artisan. Applicants have used the present invention to design swirlers for a gas turbine combustor. Once the modeling and programming of the process was done (which entailed about 160 person-hours of routine work), running the design process took about 2 person-hours to reach an acceptable design which considered numerous variations in the engineering parameter inputs. This compares to performing a conventional design process for designing swirlers for a gas turbine combustor which typically takes about 16 person-hours to reach an acceptable design which considered only a few variations in geometry variables. The Design Spreadsheet used about one thousand cells in an XESS spreadsheet environment in Unigraphics. Applicants believe the design resulting from the process of their invention is superior to a conventionally-derived design because they consider numerous variations in engineering parameter inputs instead of the conventional few variations in geometry variables. Also, another strength of the process of Applicants' invention comes with reusing the modeled and programmed process to yield other designs of the particular part. For example, with Applicants' invention, the first 100 swirler designs takes 360 person-hours (with each additional design taking about 2 hours). This compares to 1600 person-hours using a conventional design process.

It should be noted that the process of the invention is recursive in that the process is capable of designing a part, of also designing a mold to make the part, of also designing a tool used to make the mold to make the part, etc.

Thus, it is seen that the invention is expressed as a process for designing an article of manufacture or as a process for designing and making an article of manufacture. Alternatively, the invention is expressed as a digital computer 140 which includes a program for the engineering design (or engineering design and making) of an article of manufacture which instructs the digital computer 140 to perform the steps of the above-described process. Also, alternatively, the invention is expressed as a medium 120 which contains a program readable by a digital computer 140 for the engineering design (or engineering design and making) of an article of manufacture which instructs the digital computer 140 to perform the steps of the above-described process.

The foregoing description of several embodiments of the invention has been presented for purposes of illustration. It is not intended to be exhaustive or to limit the invention to the precise form disclosed, and obviously many modifications and variations are possible in light of the above teaching. It is intended that the scope of the invention be defined by the claims appended hereto.

What is claimed is:

1. A method comprising the steps of:
   a) defining one or more customer requirement parameters for an article of manufacture;
   b) creating a parametric geometrical representation of the article of manufacture in terms of geometric parameters using a computer aided design program, the parametric geometrical representation of the article of manufacture defining a master model;
   c) storing the master model on a computer medium;
   d) choosing one or more engineering parameters relating to the customer requirement parameters;
   e) creating a design analysis methodology that relates the master model to the engineering parameters and the customer requirement parameters;
   f) programming the design analysis methodology into a computer code such that the engineering parameters and the customer requirement parameters are program inputs and the geometric parameters of the master model are program outputs;
   g) storing the computer code on the computer medium;
   h) inputting specific values of the engineering parameters and the customer requirement parameters into the computer code; and
   i) running the computer code on a digital computer and outputting therefrom specific values of the geometric parameters of the master model,
   wherein step f) includes programming the design analysis methodology into an iterative computer code,
   wherein step i) includes the step of iteratively running the computer code,
   wherein step f) includes programming the design analysis methodology into an iterative computer code such that in step i) one or more of the outputted specific values of the geometric parameters of the master model are manually overridable after which the computer code continues iteratively rerunning and outputting therefrom other specific values for the geometric parameters of the master model while keeping the manually overridden values.

2. The method of claim 1 also including the step of making the article of manufacture having the outputted specific values of the geometric parameters of the master model obtained from step i).

3. A method comprising the steps of:
   a) defining one or more customer requirement parameters for an article of manufacture;
   b) creating a parametric geometrical representation of the article of manufacture in terms of geometric parameters using a computer aided design program, the parametric geometrical representation of the article of manufacture defining a master model;
   c) storing the master model on a computer medium;
   d) choosing one or more engineering parameters relating to the customer requirement parameters;
   e) creating a design analysis methodology that relates the master model to the engineering parameters and the customer requirement parameters;
   f) programming the design analysis methodology into a computer code such that the engineering parameters and the customer requirement parameters are program inputs and the geometric parameters of the master model are program outputs;
   g) storing the computer code on the computer medium;
   h) inputting specific values of the engineering parameters and the customer requirement parameters into the computer code;
   i) running the computer code on a digital computer and outputting therefrom specific values of the geometric parameters of the master model;
   j) choosing a manufacturing process including manufacturing criteria and one or more manufacturing enablers to make the article of manufacture;
   k) creating a manufacturing analysis methodology that relates the manufacturing process to the engineering parameters and the geometric parameters of the master model;
   l) creating a parametric geometrical representation of the manufacturing enablers in terms of geometric parameters using a computer aided design program, the parametric geometrical representation of the manufacturing enablers defining a manufacturing enabler model;
   m) storing the manufacturing enabler model on the computer medium;

n) incorporating the manufacturing analysis methodology into the computer code such that the manufacturing criteria are computer code inputs; and o) inputting specific values of the manufacturing criteria into the computer code, wherein step i) also includes outputting from the computer code specific values of the geometric parameters of the manufacturing enabler model, wherein step f) includes programming the design analysis methodology into an iterative computer code, wherein step i) includes the step of iteratively running the computer code, wherein step n) includes incorporating the manufacturing analysis methodology into the iterative computer code such that in step i) one or more of the outputted specific values of the geometric parameters of the manufacturing enabler model are manually overridable after which the computer code continues iteratively rerunning and outputting therefrom other specific values of the geometric parameters of the manufacturing enabler model while keeping the manually overridden values of the geometric parameters of the manufacturing enabler model.

4. The method of claim 3 also including the step of making the article of manufacture having the outputted specific values of the geometric parameters of the master model obtained from step i) by using the manufacturing process chosen in step j) with the outputted specific values of the geometric parameters of the manufacturing enabler model also obtained from step i).

5. The method of claim 3, wherein step f) includes programming the design analysis methodology into an iterative computer code such that in step i) one or more of the outputted specific values of the geometric parameters of the master model are manually overridable after which the computer code continues iteratively rerunning and outputting therefrom other specific values for the geometric parameters of the master model while keeping the manually overridden values of the geometric parameters of the master model.

6. The method of claim 5 also including the step of making the article of manufacture having the outputted specific values of the geometric parameters of the master model obtained from step i) by using the manufacturing process chosen in step j) with the outputted specific values of the geometric parameters of the manufacturing enabler model also obtained from step i).

* * * * *